United States Patent [19]

Hazama

[11] Patent Number: 5,780,894
[45] Date of Patent: Jul. 14, 1998

[54] NONVOLATILE SEMICONDUCTOR MEMORY DEVICE HAVING STACKED-GATE TYPE TRANSISTOR

[75] Inventor: Katsuki Hazama, Tokyo, Japan

[73] Assignee: Nippon Steel Corporation, Tokyo, Japan

[21] Appl. No.: 802,946

[22] Filed: Feb. 21, 1997

[30] Foreign Application Priority Data

Feb. 23, 1996 [JP] Japan ................... 8-061866

[51] Int. Cl.[6] ................................. H07L 29/788
[52] U.S. Cl. ........................... 257/326; 257/316
[58] Field of Search ......................... 257/314, 315, 257/326, 316

[56] References Cited

U.S. PATENT DOCUMENTS

| | | | |
|---|---|---|---|
| 4,395,724 | 7/1983 | Iwahashi et al. | 257/316 |
| 4,477,883 | 10/1984 | Wada | 257/321 |
| 5,204,542 | 4/1993 | Namaki et al. | 257/315 |
| 5,412,238 | 5/1995 | Chang | 257/315 |

FOREIGN PATENT DOCUMENTS

B-62-44702 of 1980 Japan .

5-206472 8/1983 Japan ......................... 257/316

*Primary Examiner*—David B. Hardy
*Attorney, Agent, or Firm*—Pollock, Vande Sande & Priddy

[57] ABSTRACT

A nonvolatile semiconductor memory device includes a semiconductor substrate having at least one active region defined between two adjacent element-isolation regions and extending in a first direction, a first insulation film formed on a surface of the semiconductor substrate at the active region, and at least one memory cell transistor having a stacked gate structure including a floating gate and a control gate formed on the first insulation film and extending in a second direction intersecting the first direction. The floating gate has a center portion disposed on the active region, a first portion disposed adjacent to the center portion and extending in the second direction over one of the two adjacent element-isolation regions and a second portion disposed adjacent to the center portion and extending in the second direction over the other of the two adjacent element-isolation regions. The center portion and the first portion have a substantially uniform width as measured in the first direction while the second portion includes a portion having a width larger than that of the first portion.

20 Claims, 5 Drawing Sheets

5,780,894

NONVOLATILE SEMICONDUCTOR MEMORY DEVICE HAVING STACKED-GATE TYPE TRANSISTOR

BACKGROUND OF THE INVENTION

1. Field of the Invention

The present invention relates generally to a nonvolatile semiconductor memory device comprising stacked-gate type transistors. More particularly, the invention is concerned with a nonvolatile semiconductor memory device comprising memory cells, each including a transistor having a stacked-gate structure including a floating gate and a control gate stacked together.

2. Description of the Related Art

The electrically erasable programmable read-only memory (hereinafter referred to as the EEPROM) which is typical of the nonvolatile semiconductor memory devices whose features are that data stored therein can be retained without being erased or lost even when a power supply thereto is interrupted and that writing data or information in the memory cells as, well as erasure thereof, can be performed electrically.

FIG. 5 of the accompanying drawings is an equivalent circuit diagram of the memory cell transistor, depicted on the presumption that the memory cell transistor is comprised of two capacitive elements connected in series. In this regards, the capacitance value of the capacitive element having the silicon oxide film 44 as a capacitive insulation film is represented by $C_1$, while the capacitance value of the capacitive element having the insulation film 46 as the capacitive insulation film is represented by $C_2$. Further, it is assumed that a potential $V_2$ is applied to the control gate 47 and the p-type silicon semiconductor substrate 43 is connected to the ground potential (GND). Then, the potential $V_1$ at the floating gate 45 (i.e., the voltage applied to the silicon oxide film 44) is represented by $$V_1 = C_2 \cdot V_2 / (C_1 + C_2) \quad (1)$$

As is apparent from the above expression (1), in order to shorten the time required for rewriting the stored information by increasing the voltage $V_1$ applied to the silicon oxide film 44, while keeping the voltage $V_2$ applied to the control gate 47 constant, it is necessary to increase the capacitance value $C_2$ relative to the capacitance value $C_1$.

On the other hand, in the case of an EEPROM in which each of the memory cells is constituted by two transistors, including a MOS transistor connected in series to the memory cell transistor as a switching transistor for serving as a selecting transistor, data can be erased on a cell-by-cell basis. In this way, stable operation of the EEPROM can be ensured. By way of example, the problem that the threshold value of the stacked-gate type transistor assumes a negative value after the erasing operation, known as over-erasing, can be avoided. Accordingly, the EEPROM in which each of the memory cells is provided with the selecting transistor is advantageous in that the productivity and reliability of the device are high.

In the case of the EEPROM memory cell as mentioned-above, the floating gate is so formed on the field oxide film to be elongated in the direction in which the control gate extends so as to enlarge the overlap area between the floating gate and the control gate. This thereby increase the ratio of the area of the insulation film to that of the tunnel oxide film in order to increase the capacitance value $C_2$ relative to the capacitance value $C_1$. However, with the arrangement described above, one side of the area occupied by the memory cell becomes longer in the direction in which the control gate extends, resulting in an enlarged area for the single memory cell. Thus, difficulty is encountered in realizing both of the shorter time required for rewriting the stored information and the smaller size of the memory cell.

Under the circumstances, in the case of the EEPROM device disclosed in Japanese Patent Publication No. 62-44702, the floating gate is formed to have both end portions, each having a width broader than the width of its center portion, such that each end portion projects at its one side.

In this manner, by making effective use of the gap for ensuring insulation between the selecting gate and the stacked-gate structure of the floating gate and the control gate, the overlap area between the floating gate and the control gate can be enlarged. This ensures that the gate length of the selecting gate is greater than a predetermined length, without extending the floating gate longer in the direction in which the control gate extends, thereby increasing the capacitance value $C_2$ relative to the capacitance value $C_1$. Thus, the memory cell can be implemented in a fine structure in the direction in which the control gate extends.

However, in the case of the EEPROM device as described Japanese patent publication No. 62-44702, if the capacitance value $C_2$ is further increased while not changing the occupation area for the memory cell, it is be difficult to ensure insulation between the floating gate and the selecting gate, because the wider portion of the floating gate projecting toward the selecting gate approaches unnecessarily close to the selecting gate. For this reason, in this EEPROM, it is impossible to make the capacitance value $C_2$ larger than a predetermined value, so that it is difficult, if not impossible, to reduce any further the time needed for rewriting the stored information or data.

SUMMARY OF THE INVENTION

It is an object of the present invention to provide a nonvolatile semiconductor memory device which includes stacked-gate type transistors and in which the time taken for rewriting information can be shortened, while allowing a significant reduction in the area to be occupied by each memory cell.

In view of the above and other objects which will become apparent as the description proceeds, there is provided according to a general aspect of the present invention a nonvolatile semiconductor memory device which includes a semiconductor substrate having at least one active region defined between adjacent two element-isolation regions and extending in a first direction. A first insulation film is formed on a surface of the semiconductor substrate at the active region, and at least one memory cell transistor having a stacked gate structure including a floating gate and a control gate is formed on the first insulation film and extending in a second direction intersecting the first direction. The floating gate has a center portion disposed on the active region, a first portion disposed adjacent to the center portion and extending in the second direction over one of the two adjacent element-isolation regions and a second portion disposed adjacent to the center portion and extending in the second direction over the other of the two adjacent element-isolation regions. The center portion and the first portion have a substantially uniform width as measured in the first direction, while the second portion includes a portion having a width larger than that of the first portion.

In a preferred mode for carrying out the invention, a plurality of the memory cell transistors are arrayed in the second direction, while the floating gates of two adjacent memory cell transistors are preferably shaped symmetrically to each other relative to a boundary between two memory cell transistors.

In the nonvolatile semiconductor memory device according to the invention, the floating gate includes a first portion having a predetermined width and a second portion of a greater width than that of the first portion with the channel region being sandwiched between the first and second portions. Due to this feature, the selecting gate of the selecting transistor can be disposed so as to face to a portion of the floating gate other than its portion having a greater width, whereby a sufficient distance or gap can be provided between the stacked gate, including the floating gate, so that the required dielectric strength between the stacked gate and the selecting gate can be ensured irrespective of possible errors in the process for forming the stacked gate and the selecting gate.

Furthermore, by virtue of an arrangement that the first portion of the floating gate is of a constant and narrow width and a relatively large width portion is provided only to the second portion, it is sufficient to take into consideration only the second portion of the floating gate in determining the gap or distance as viewed in the second direction between the broader-width portion of the floating gate and the selecting gate, so that the restriction imposed on determining of the length of the floating gate in the second direction can be mitigated. Thus, when maintaining the area of the floating gate constant, the length of the floating gate in the second direction can be reduced as compared with the conventional device, whereby the area to be occupied by each memory cell can be reduced without increasing the time required for rewriting the data or information stored in the memory cell. Alternatively, when maintaining the length of the floating gate constant, the area of the floating gate can be increased as compared with the conventional device, whereby the time taken for rewriting the data stored in the memory cell can be shortened, without increasing the area for each memory cell.

The above and other objects, features and attendant advantages of the present invention will more easily be understood by reading the following description of the preferred embodiments thereof taken, only by way of example, in conjunction with the accompanying drawings.

DESCRIPTION OF THE PREFERRED EMBODIMENTS

Now, the present invention will be described in detail in conjunction with what is presently considered as preferred embodiments thereof by reference to the drawings.

Figure 1A:
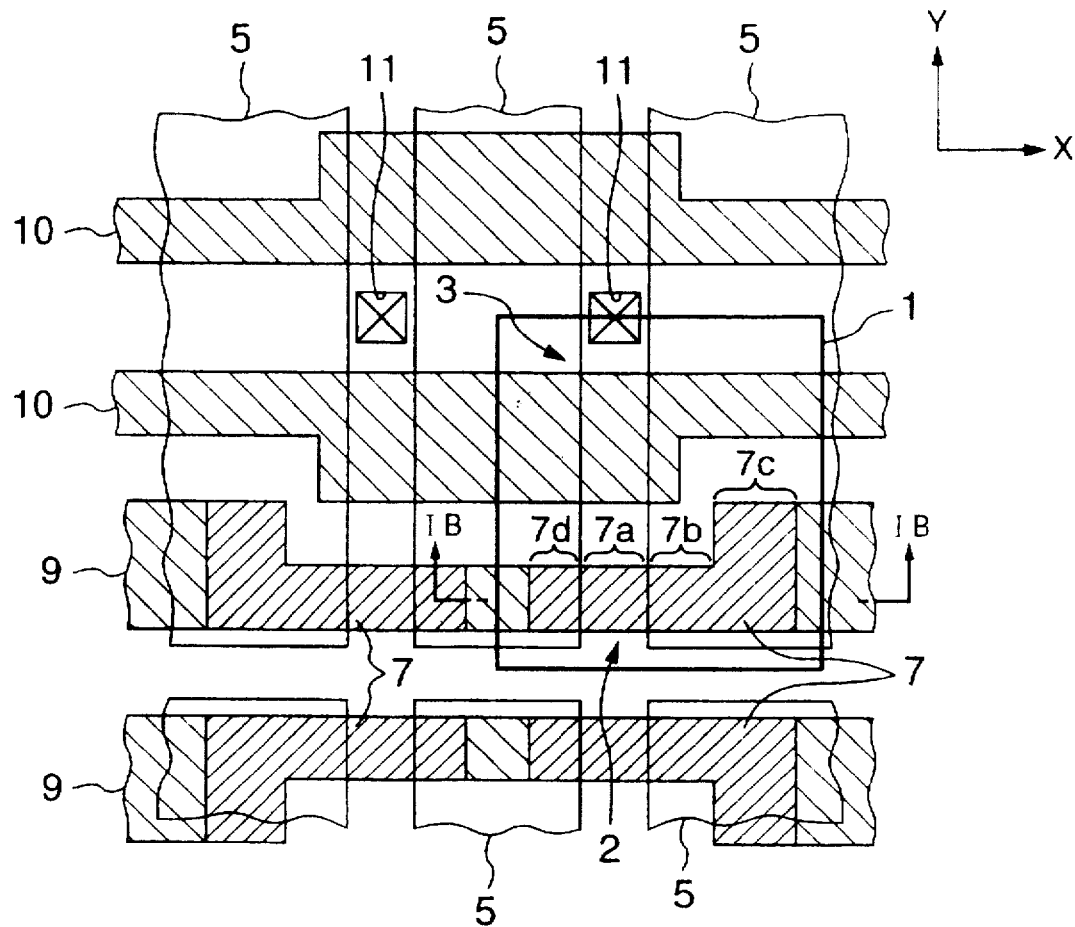
FIG. 1A is a plan view showing a structure of an EEPROM according to a first embodiment of the present invention.
Figure 1B:
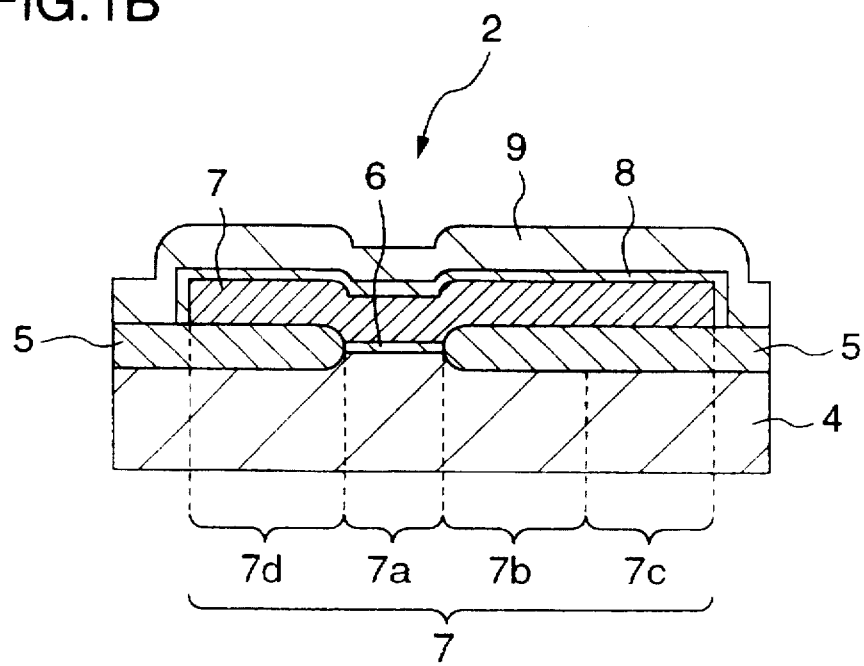
FIG. 1B is a sectional view of the same taken along a line IB—IB shown in FIG. 1A.

A nonvolatile semiconductor memory device according to a first embodiment of the invention will be described by reference to FIGS. 1A and 1B in which FIG. 1A is a plan view showing an EEPROM including two-transistor type memory cells according to the first embodiment, and FIG. 1B is a sectional view of the same taken along a line IB—IB shown in FIG. 1A.

Referring to FIG. 1A, the EEPROM includes a plurality of memory cells 1 disposed on a surface of a semiconductor substrate 4 in a matrix of rows extending in a X-direction and columns extending in a Y-direction, wherein each of the memory cells 1 includes a stacked-gate type memory cell transistor 2 and a selecting transistor 3. Deposited selectively on the surface of the semiconductor substrate 4 are field oxide films to define element-isolation regions 5, and an active region is formed between two adjacent element-isolation regions 5. Each of the memory cell transistors 2 has a stacked gate which includes a floating gate 7, a capacitive coupling insulation film 8 (having a thickness of about 30 nm) such as an ONO-film (silicon oxide film/silicon nitride film/silicon oxide film) and a control gate 9, all of which are stacked in that order. A tunnel oxide film 6 of about 11 nm in thickness is formed on the surface of the active region mentioned above. The floating gate 7 of the memory cell transistor 2 is formed over the tunnel oxide film 6 and the field oxide films 5 disposed at both sides of the tunnel oxide film 6 to extend in the X-direction (i.e., rowwise). A surface portion of the semiconductor substrate 4 underlying the tunnel oxide film 6 constitutes a channel region of the memory cell transistor, while a pair of impurity diffusion regions (not shown) serving as source and drain regions, respectively, are formed in the active region at both sides of the floating gate 7, respectively. Further, the control gate interconnecting conductor film 9 for a plurality of memory cell transistors arrayed in the X-direction is formed by a continuous film serving as a word line.

Additionally, a selecting gate 10 serving as a gate electrode for each of the selecting transistors 3 incorporated, respectively, in a plurality of memory cells arrayed in the X-direction is formed by a continuous film serving as a selecting line to extend on a silicon oxide film (not shown) formed on the surface of the active region of the semiconductor substrate 4 and the field oxide film 5 in parallel with the control gate interconnecting conductor film 9 as above-mentioned.

Further, a pair of impurity diffusion layers (not shown) which serve as a source and a drain, respectively, are formed in the active region at both sides of the selecting gate 10. The memory cell transistor 2 and the selecting transistor 3 have in common one of the impurity diffusion layers. The other of the impurity diffusion layers of the selecting transistor 3 is connected to the bit line (not shown) through a contact hole 11.

Figure 4:
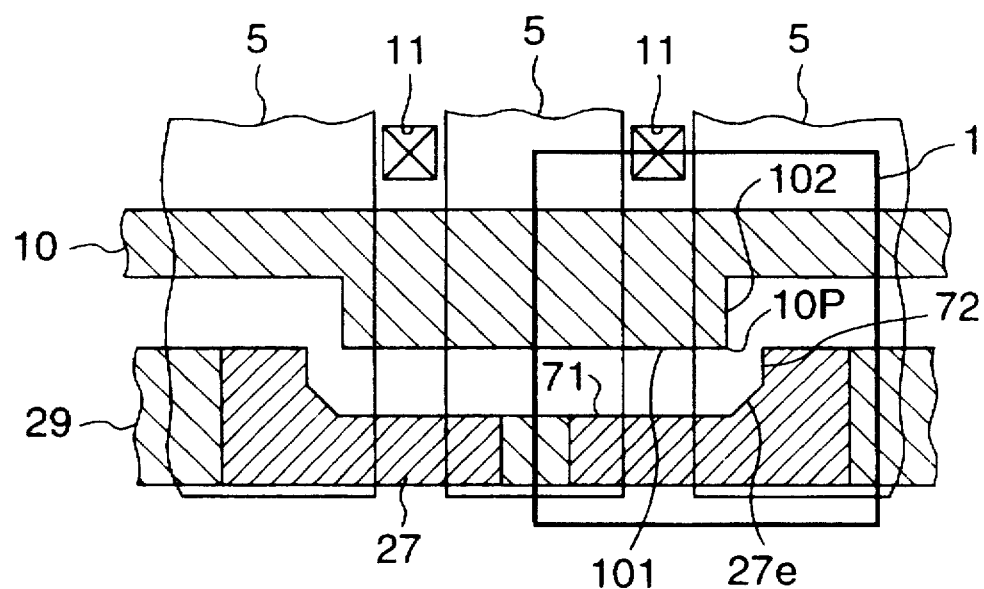
FIG. 4 is a plan view showing a structure of an EEPROM according to a third embodiment of the invention.

In the case of the EEPROM memory cell 1 shown in FIG. 1A, in order to increase the area of the insulation film 8 relative to the tunnel oxide film 6, i.e., increase the capacitance value $C_2$ relative to the capacitance value $C_1$, as described hereinbefore by reference to FIG. 4, the floating gate 7 is formed to extend over both the tunnel oxide film 6 disposed in the channel region and the field oxide films 5 located at both sides of the tunnel oxide film 6 so that the overlapping area of the floating gate 7 and the control gate 9 is increased.

Further, as can be seen in FIGS. 1A and 1B, the floating gate 7 includes a center portion 7a located on the channel region, a portion 7b located on one of the field oxide films 5 adjacent to the center portion 7a in the X-direction, a portion 7c continuing from the portion 7b and having a width as measured in the Y-direction twice that of the portion 7b, and a portion 7d located on the other one of the field oxide films 5 adjacent to the center portion 7a. Of these portions 7a to 7d, the portions 7a, 7b and 7d are of the same width. Further, the length of the portion 7d as measured in the X-direction is shorter than the length of the portion 7b. Thus, the floating gate of each memory cell transistor has an L-shaped configuration.

As can be seen in the figures, the floating gate of each stacked-gate type transistor has a shape asymmetrical with regard to the Y-direction center line of the element active region defined between adjacent two element-isolation regions to extend in the Y-direction, while the floating gates of the two stacked-gate type transistors located adjacent to each other in the X-direction in which the control gate 9 extends are shaped symmetrically to each other with respect to a boundary between the two adjacent stacked-gate type transistors. More specifically, the two adjacent stacked-gate type transistors are disposed in a positional relationship with each other such that the broad-width portions 7c or the narrow-width portions 7d of the floating gates of these transistors face to each other. Accordingly, the conductor layer 9 interconnecting the control gates of the stacked-gate type transistors 2 arrayed in the X-direction is formed with a plurality of projections disposed in the X-direction at intervals each corresponding to two memory cells.

On the other hand, the conductor film 10 interconnecting the selecting gates of the selecting transistors arrayed in the X-direction is formed with a plurality of projections disposed at intervals each corresponding to two memory cells in the X-direction in which the control gate interconnecting conductor film 9 extends, so that the projections of the selecting gate interconnecting conductor film 10 are facing to wards the recesses, respectively, of the conductor film 9 interconnecting the control gates, while the recesses of the selecting gate interconnecting conductor film 10 are facing to wards the projections of the control gate interconnecting conductor film 9, respectively. By disposing the projections of the control gate interconnecting conductor film 9 and the projections of the selecting gate interconnecting conductor film 10 with an offset corresponding to two memory cells in this manner, it is possible to ensure a gate length of the selecting gate in the active region greater than a predetermined value, while restricting the length of one memory cell as measured in the X-direction to a as small a value as possible. Also, there can be realized a gap required for insulation between the selecting gate and the floating gate on one hand and the control gate on the other hand. At this juncture, it should further be mentioned that for the distance between the floating gate and the selecting gate in the X-direction, it is sufficient to take into consideration only the distance between the portion 7c of the floating gate and the projection of the selecting gate.

Figure 2A:
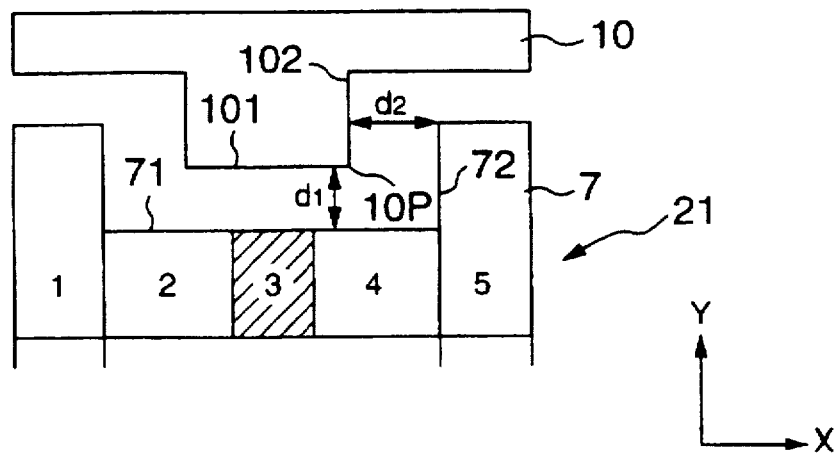
FIGS. 2(a) to 2(c) are views for illustrating the reasons why the area occupied by each memory cell can be decreased by the present invention.
Figure 2B:
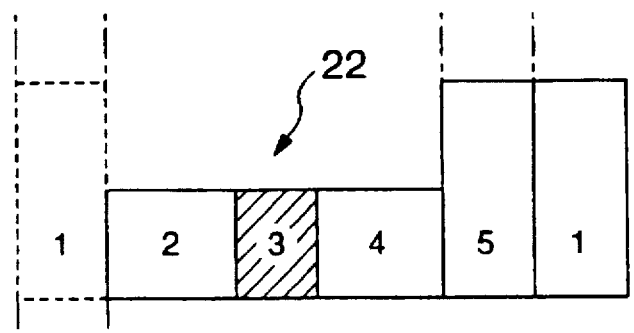
Figure 2C:
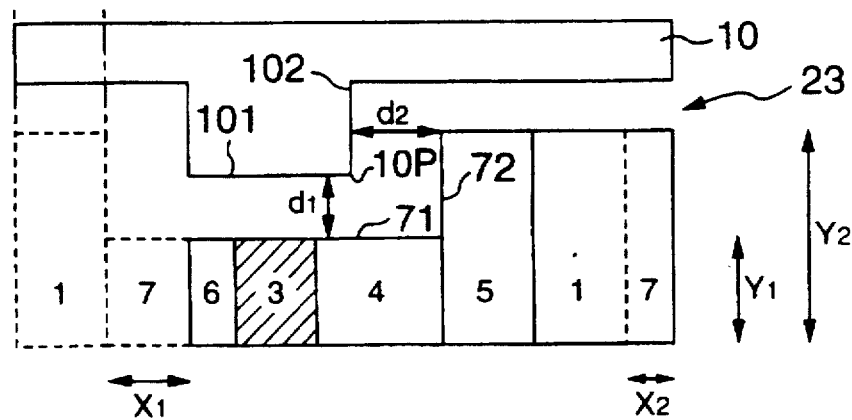

Next, in conjunction with the stacked-gate type transistor memory cell according to the first embodiment of the invention, a description will be give as to the reason why the area occupied by the memory cell 1 can be decreased as compared with the conventional device by referring to FIGS. 2(a) to 2(c).

FIG. 2(a) is a schematic diagram showing a floating gate having a shape equivalent to that of the floating gate of the conventional device. For the convenience of description, the floating gate 21 is divided into five sections in the direction orthogonal to the extension of the control gate, wherein these sections are designated by (1) to (5), respectively. Of these sections (1) to (5), the section (3) lies on the channel region and the other sections (1), (2), (4) and (5) are located on the element-isolation region. Further, sections (1) and (5) have a width $Y_2$ which is twice as large as the width $Y_1$ of sections (2) to (4), and sections (1) and (2) are identical in shape with the sections (5) and (4), respectively.

FIG. 2(b) is a schematic diagram showing a pattern of the floating gate 22 which is obtained by displacing the section (1) of the floating gate 21 shown in FIG. 2(a) to the right side of the section (5). In the case of the floating gate 22 shown in FIG. 2(b), its length measured in the direction in which the control gate extends is equal to the length of floating gate 21 shown in FIG. 2(a), because the floating gate 22 shown in FIG. 2(b) is different from the floating gate 21 shown in FIG. 2(a) only in that the position of the section (1) is displaced without changing its shape.

FIG. 2(c) is a schematic diagram showing a pattern of the floating gate 23 which is obtained by displacing a portion (7) of the section (2) of the floating gate 22 shown in FIG. 2(b) to the right side of the section (1). In this case, because the portion (7), which has a width $Y_1$ and a length $X_1$ as measured in the direction in which the control gate extends before being displaced, is displaced so as to keep its area unchanged, the portion (7) as displaced to the right side of the section (1) has a width $Y_2$, which is twice as large as the original width $Y_1$, and a length $X_2$, which is half of the original length $X_1$. As a result, the length in the direction in which the control gate extends is shortened by ½ $X_1$=($X_1$−$X_2$). Additionally, the length of a remaining portion (6) of the section (2) as measured in the extending direction of the control gate becomes shorter than that of the section (4) by $X_1$.

As is apparent from the above description, the length of the floating gate 23 is shortened as compared with the floating gate 21 when shown in FIG. 7 by making the section (6) having, the same width as that of the section (3) shorter, than the section (4) in the length as measured in the X-direction in which the control gate extends and providing sections (1), (5) and (7) each, having a large width, only at the right side of the section (4). In this case, it is possible to reduce the area occupied by the memory cell, including the floating gate 23, because the maximum width of the floating gate 23, i.e. a maximum length as measured in the Y-direction perpendicular to the X-direction, is the same as that of the floating gate 21.

Incidentally, the above explanation has been made on the assumption that the ratio of $Y_2/Y_1$ is set to 2. However, the same advantageous effects can be obtained by setting the ratio of $Y_2/Y_1$ to any value larger than 1.

At this juncture, it should be mentioned that the position of the floating gate 7 relative to the selecting gate of the selecting transistor is determined so that a predetermined minimum distance is ensured between the floating gate 7 and the selecting gate 10 in the device according to the present invention. More specifically, as shown in FIGS. 2(a) and 2(c), designating top and side planes of the projection of the selecting gate 10 by 101 and 102, respectively, a plane of the narrow width portion of the floating gate facing to the plane 101 by 71, and a plane of the broad width portion of the floating gate facing to the side plane 102 by 72, the shortest distance between the floating gate and the selecting gate is represented either by a distance d1 between the planes 101 and 71 or a distance d2 between the planes 102 and 72. Thus, the position of the floating gate relative to the selecting gate is determined so that the distance d1 or d2 is equal to or greater than a predetermined minimum distance D.

Next, a description will be given of how much the area occupied by the memory cell 1 in the EEPROM can be reduced according to the present embodiment of the invention.

In the case of the conventional EEPROM described-above, the memory cell 51a has a length of 4.2 μm in the X-direction, a length of 5.6 μm in the Y-direction orthogonal to the X-direction and hence an occupation area of 23.52 μm². On the other hand, in the case of the memory cell 1 according to the present embodiment of the invention, described by reference to FIG. 1A, has a length of 3.8 μm in the X-direction, a length of 5.6 μm in the Y-direction and hence an occupation area of 21.28 μm². Thus, according to the first embodiment of the invention, the area occupied by the memory cell can be decreased by about 10%. Incidentally, it is assumed that the area of the tunnel oxide film is 1.12 μm², with that of the floating gate being 3.28 μm² in the device according to the invention as well as in the conventional device as shown in FIG. 7.

Next, consideration will be made of what degree the potential of the floating gate can be increased with a given constant potential of the control gate when the area of the floating gate is increased without decreasing the area occupied by the memory cell (i.e., without reducing the length of the floating gate in the X-direction).

As described with reference to FIG. 2(c), the length of the floating gate in the X-direction can be decreased by holding constant the area of the floating gate. In this regard, it should be appreciated that the area of the floating gate can be increased by increasing the length of the broad-width portion of the floating gate by the value by which the length of the floating gate in the X-direction is decreased as shown in FIG. 2(c), so that the original length of the floating gate is maintained. More particularly, it is assumed that the area of the floating gate 7 having a width of 2.0 μm is increased to 4.08 μm² [=3.28+2.0×(4.2−3.8)]. Accordingly, in accordance with the expression (1) previously mentioned [i.e., $V_1 = C_2 \cdot V_2/(C_1+C_2)$], the increasing ratio of the potential of the floating gate 7 can be calculated as being equal to $|(4.08/30)/\{(1.12/11)+(4.08/30)\}|/|(3.28/30)/\{(1.12/11)+(3.28/30)\}|=1.11$ on the assumption that the tunnel oxide film 6 has a thickness of 11 nm and the insulating film 8 has a thickness of 30 nm. Thus, because the capacitance value $C_2$ can be further increased with the area occupied by the memory cell remaining unchanged, the potential of the floating gate 7 can be increased by 11%, whereby the data rewriting speed can be increased correspondingly.

Next, a nonvolatile semiconductor memory device according to a second embodiment of the present invention will be described by reference to FIG. 3.

Figure 3:
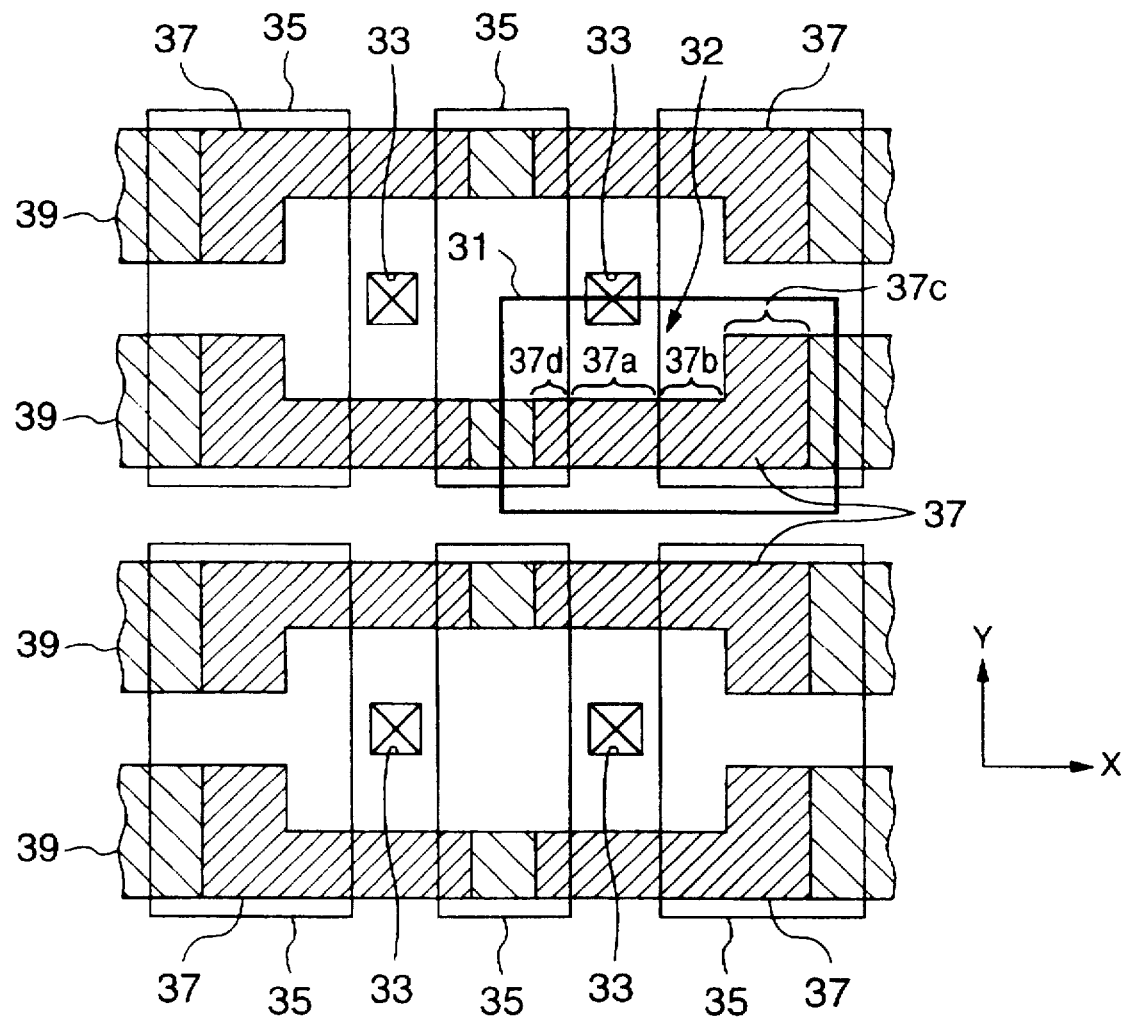
FIG. 3 is a plan view showing a structure of an EEPROM according to a second embodiment of the invention.

FIG. 3 is a plan view showing a structure of an EEPROM (flash memory) comprised of one-transistor type memory cells according to the second embodiment of the invention.

Referring to FIG. 3, one EEPROM memory cell 31 (the area occupied by which is indicated by a solid line) includes a stacked-gate type transistor 32. The stacked-gate type transistor 32 has a stacked gate structure in which a floating gate 37 and a control gate 9 are stacked together with an insulation film (not shown) interposed therebetween. Since the stacked-gate type transistor 32 has substantially the same crosssection as that shown in FIG. 1B, the description thereof is omitted. It should be mentioned however, that a pair of impurity diffusion layers serving as a source and a drain (not shown), respectively, are formed in the active region defined between the field oxide films 35 at both sides of the floating gate 37. The stacked-gate type transistor 32 has one of the impurity diffusion layers common to one of the impurity diffusion layers of another stacked-gate type transistor 32 located adjacent to the former in the Y-direction orthogonal to the X-direction in which the control gate 39 extends. On the other hand, the other impurity diffusion layer of each transistor is connected to a bit line (not shown) by way of a contact hole 33.

Figure 5:
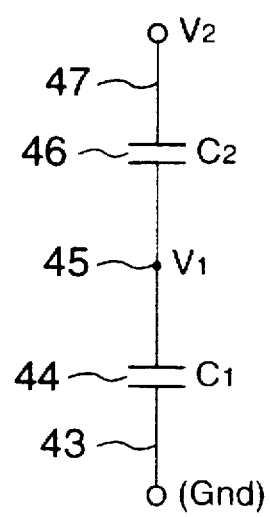
FIG. 5 is an equivalent circuit of the stacked-gate type transistor.

In the case of the EEPROM memory cell 31 shown in FIG. 3, in order to increase the capacitance value $C_2$ relative to the capacitance value $C_1$, as described hereinbefore by reference to FIG. 5, the floating gate 37 is so formed to extend over the tunnel oxide film (not shown) disposed in the channel region and the field oxide films 35 located at both sides of the tunnel oxide film, whereby the overlapping area of the floating gate 37 and the control gate 39 is increased.

Further, as can be seen in FIG. 3, the floating gate 37 includes a center portion 37a located on the channel region, a portion 37b disposed on one of the field oxide films 35 and located adjacent to the center portion 37a, a portion 37c continuing from the portion 37b and having a width twice as large as the portion 37b, and a portion 37d disposed on the other field oxide film 35 and located adjacent to the center portion 37a. Of portions 37a to 37d, the portions 37a, 37b and 37d have the same width. Further, the length of the portion 37d as measured in the X-direction is shorter than the length of the portion 37b as measured in the X-direction.

Similarly to the device shown in FIG. 3, the floating gate of each stacked-gate type transistor has a shape asymmetrical with regard to the center portion 37a, while the floating gates of the two stacked-gate type transistors located adjacent to each other in the X-direction in which the control gate 39 extends are shaped symmetrically to each other with respect to a boundary between the two adjacent stacked-gate type transistors. More specifically, the two adjacent stacked-gate type transistors are disposed in such a positional relationship that the broad-width portions 37c or narrow-width portions 37d of the floating gates of these transistors are facing to each other. Accordingly, a conductor layer 39, interconnecting the control gates of the stacked-gate type transistors 32 arrayed in the X-direction, is formed with a plurality of projections disposed in the X-direction at intervals, or pitches, each corresponding to two memory cells. In this manner, by providing the conductor layer interconnecting the control gates with projections disposed at distances each corresponding to two memory cells, the length of the memory cell in the X-direction in which the control gate 39 extends can be limited to a minimum value, while the distance between the contact hole 33 and each of the control gate 39 and the floating gate 37 can be held substantially constant in each of the stacked-gate type transistors.

Furthermore, in the device according to the present embodiment of the invention, the length of the EEPROM memory cell 31 in the X-direction can be made shorter when compared with the conventional device and the area occupied by the EEPROM memory cell 31 can be reduced for the same reasons described hereinbefore in reference to FIG. 2. On the other hand, when the length of the EEPROM memory cell 31 as measured in the X-direction is kept the same as that of the conventional device, the area of the floating gate 37 can be increased without increasing the area occupied by the EEPROM memory cell 31, whereby the potential of the floating gate 37 can be increased, so that the data rewriting operation can be performed at a higher speed.

Next, description will be given for a nonvolatile semiconductor memory device according to a third embodiment of the present invention by reference to FIG. 4. The device according to the present embodiment of the invention is a partial modification of the device according to the first and second embodiments. More specifically, FIG. 4 shows a device according to the third embodiment of the invention which corresponds to a partial modification of the device according to the first embodiment. As described previously in conjunction with the first embodiment, the positional relation between the floating gate of the stacked-gate type transistor and the selecting gate of the selecting transistor is determined so that a predetermined minimum distance is be ensured between the floating gate and the selecting gate.

Figure 4A:
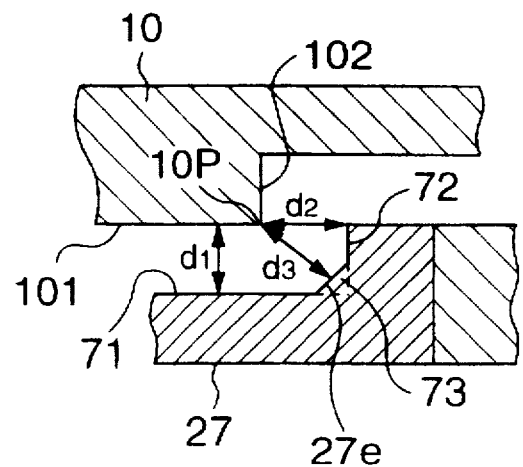
FIG. 4A is an enlarged view of a part of FIG. 4.

As shown in FIG. 4, designating the top and side planes of the projection formed on the selecting gate 10 by "101" and "102", respectively, a plane of the narrow-width portion of the floating gate facing to the plane 101 by 71, and a plane of the broad width portion of the floating gate facing to the plane 102 by 72, the shortest distance between the floating gate and the selecting gate is represented by either a distance d1 between the planes 101 and 71 or a distance d2 between the planes 102 and 72. Thus, the relative position of the floating gate to the selecting gate is so determined so that each of the distances d1 and d2 is equal to or greater than a minimum distance D. In the case where the floating gate 7 and the selecting gate 10 are implemented in such shape as illustrated in FIG. 1A, the area occupied by the memory cell 1 becomes a minimum when each of the distances d1 and d2 is equal to the shortest distance D. In that case, a distance between an edge line 10P along which the planes 101 and 102 intersect with each other and a corner defined between the planes 71 and 72 will become unnecessarily longer than the shortest distance D. Thus, in the device according to the third embodiment of the invention, a corner portion 27e is formed at the corner defined between the planes 71 and 72 and the length of the floating gate 27 in the X-direction is reduced by a distance corresponding to the area of the corner portion 27e. In this case, the corner portion 27e may be formed with any desired shape so long as a distance d3 between the plane 73 facing the edge line 10P of the corner portion 27e and the edge line 10P is equal to or greater than the shortest distance D. By way of example, the plane 73 of the corner portion 27e may be formed with a flat surface such that the width of the floating gate 27 in the Y-direction increases gradually, as shown in FIG. 4A. Alternatively, the plane 73 of the corner portion 27e may be formed of a cylindrical surface having a radius equal to or greater than the distance D with the edge line 10P being its center line. Furthermore, both the distance d1 between the planes 71 and 101 and the distance d2 between the planes 72 and 102 may be made equal to the predetermined shortest distance so that a plane 73 of the corner portion 27e constitutes a part of an arc having a radius equal to the distance D as viewed in the cross-section of FIG. 4A.

In the first, second and third embodiments of the present invention as mentioned-above, the teachings of the invention are applied to the two-transistor or one-transistor type EEPROMs. It should, however, be understood that the invention can be equally applied to other nonvolatile semiconductor memory device such as EPROM having stacked-gate transistors.

As is apparent from the foregoing, in the nonvolatile semiconductor memory device according to the present invention, when the area of the floating gate is held constant, the length of the individual memory cell as measured in the direction in which the control gate extends can be shortened while ensuring sufficient insulation between the floating gate and the other conductive films, whereby the nonvolatile semiconductor memory device can be implemented with high integration density. On the other hand, when the length of the memory cell as measured in the direction in which the control gate extends is held constant, the area of the floating gate can be increased, whereby the time required for rewriting data or information stored in the nonvolatile semiconductor memory device can be shortened significantly.

I claim:

1. A nonvolatile semiconductor memory device comprising:

a semiconductor substrate having at least one active region defined between two adjacent element-isolation regions and extending in a first direction;

a first insulation film formed on a surface of said semiconductor substrate at said active region; and at least one memory cell transistor having a stacked gate structure including a floating gate and a control gate formed on said first insulation film and extending in a second direction intersecting said first direction, wherein said floating gate has a center portion disposed on said active region, a first portion disposed adjacent to said center portion and extending in said second direction over one of said two adjacent element-isolation regions and a second portion disposed adjacent to said center portion and extending in said second direction over the other of said two adjacent element-isolation regions, wherein said center portion and said first portion have a substantially uniform width as measured in said first direction while said second portion includes a part having a width larger than that of said first portion, and wherein a plurality of said memory cell transistors are arrayed in said second direction, and the floating gates of two adjacent memory cell transistors are shaped symmetrically to each other relative to a boundary between said two memory cell transistors.

2. A nonvolatile semiconductor memory device according to claim 1, wherein each of said memory cell transistors and different one of said memory cell transistors located adjacent to one side of said each memory cell transistor are so disposed that said first portion of the floating gates of said each memory cell transistor and said different one memory cell transistor face to each other while each of said memory cell transistors and another one of said memory cell transistors located adjacent to the other side of said each memory cell transistor are so disposed that said second portion of the floating gates of said each memory cell transistor and said another memory cell transistor face to each other.

3. A nonvolatile semiconductor memory device according to claim 1, said second portion of said floating gate including a third portion connected directly to said center portion, and a fourth portion separated from said center portion and connected directly to said third portion, wherein said third portion has substantially the same width as that of said center portion while said fourth portion has a width larger than that of said center portion.

4. A nonvolatile semiconductor memory device according to claim 3, further comprising:

a memory cell selecting transistor disposed adjacent to said memory cell in said first direction, said selecting transistor having a selecting gate,

11 wherein said selecting gate includes a first portion having a substantially constant width as measured in said first direction and a second portion having a width larger than that of said first portion, and wherein said first portion of said selecting gate is disposed in opposition to said fourth portion of said floating gate, while said second portion of said selecting gate is disposed in opposition to said first portion, said center portion and said third portion of said floating gate.

5. A nonvolatile semiconductor memory device according to claim 3, wherein said fourth portion has a uniform width larger than that of said center portion.

6. A nonvolatile semiconductor memory device according to claim 3, wherein said fourth portion includes a fifth portion having a width increasing gradually and a sixth portion having a substantially constant width larger than that of said third portion.

7. A nonvolatile semiconductor memory device according to claim 1, wherein the width of the part of said second portion is at least twice the width of said first portion.

8. A nonvolatile semiconductor memory device according to claim 1, wherein said floating gate has a shape asymmetric with respect to a center line extending through a center of said active region.

9. A nonvolatile semiconductor memory device according to claim 1, wherein said floating gate has an L-shaped configuration.

10. A nonvolatile semiconductor memory device according to claim 1, wherein the width of the part of said second portion is at least twice the width of said first portion and said floating gate has a shape asymmetric with respect to a center line extending through a center of said active region.

11. A nonvolatile semiconductor memory device according to claim 1, wherein the width of the part of said second portion is at least twice the width of said first portion, and said floating gate has an L-shaped configuration.

12. A nonvolatile semiconductor memory device according to claim 1, wherein said floating gate has an L-shaped configuration so that said floating gate has a shape asymmetric with respect to a center line extending through a center of said active region.

13. A nonvolatile semiconductor memory device according to claim 1, wherein the width of the part of said second portion is at least twice the width of said first portion and said floating gate has an L-shaped configuration so that said floating gate has a shape asymmetric with respect to a center line extending through a center of said active region.

14. A nonvolatile semiconductor memory device according to claim 2, wherein the width of the part of said second portion is at least twice the width of said first portion and said floating gate has a shape asymmetric with respect to a center line extending through a center of said active region.

15. A nonvolatile semiconductor memory device according to claim 2, wherein the width of the part of said second portion is at least twice the width of said first portion and said floating gate has an L-shaped configuration.

16. A nonvolatile semiconductor memory device according to claim 2, wherein said floating gate has an L-shaped configuration so that said floating gate has a shape asymmetric with respect to a center line extending through a center of said active region.

12

17. A nonvolatile semiconductor memory device according to claim 2, wherein the width of the part of said second portion is at least twice the width of said first portion and said floating gate has an L-shaped configuration so that said floating gate has a shape asymmetric with respect to a center line extending through a center of said active region.

18. A nonvolatile semiconductor memory device comprising:

a semiconductor substrate having at least one active region defined between two adjacent element-isolation regions and extending in a first direction;

a first insulation film formed on a surface of said semiconductor substrate at said active region; and at least one memory cell transistor having a stacked gate structure including a floating gate and a control gate formed on said first insulation film and extending in a second direction intersecting said first direction, wherein said floating gate has a center portion disposed on said active region, a first portion disposed adjacent to said center portion and extending in said second direction over one of said two adjacent element-isolation regions and a second portion disposed adjacent to said center portion and extending in said second direction over the other of said two adjacent element-isolation regions, wherein said second portion includes a third portion connected directly to said center portion and a fourth portion separated from said center portion and connected directly to said third portion, wherein said center portion and said first portion have a substantially uniform width as measured in said first direction, while said third portion has substantially the same width as that of said center portion and said fourth portion has a width larger than that of said center portion, and wherein said memory device further comprises:

a memory cell selecting transistor disposed adjacent to said memory cell transistor in said first direction, said selecting transistor having a selecting gate;

wherein said selecting gate includes a first portion having a substantially constant width as measured in said first direction and a second portion having a width larger than that of said first portion, and wherein said first portion of said selecting gate is disposed in opposition to said fourth portion of said floating gate, while said second portion of said selecting gate is disposed in opposition to said first portion, said center portion and said third portion of said floating gate.

19. A nonvolatile semiconductor memory device according to claim 18, wherein said fourth portion of said floating gate has a uniform width larger than that of said center portion of said floating gate.

20. A nonvolatile semiconductor memory device according to claim 18, wherein said fourth portion of said floating gate includes a fifth portion having a width increasing gradually and a sixth portion having a substantially constant width larger than that of said third portion of said floating gate.

* * * * *